(12) United States Patent  
Hashimoto et al.

(10) Patent No.: US 9,166,298 B2  
(45) Date of Patent: Oct. 20, 2015

(54) WIRELESS DEVICE, AND INFORMATION PROCESSING APPARATUS AND STORAGE DEVICE INCLUDING THE WIRELESS DEVICE

(71) Applicant: KABUSHIKI KAISHA TOSHIBA, Tokyo (JP)

(72) Inventors: Koh Hashimoto, Yokohama (JP); Yukako Tsutsumi, Kawasaki (JP); Takayoshi Ito, Yokohama (JP); Koji Akita, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 112 days.

(21) Appl. No.: 13/940,022

(22) Filed: Jul. 11, 2013

(65) Prior Publication Data

US 2014/0055939 A1     Feb. 27, 2014

(30) Foreign Application Priority Data

Aug. 24, 2012   (JP) ................. 2012-185118

(51) Int. Cl.
| | |
|---|---|
| *H05K 1/16* | (2006.01) |
| *H01Q 13/10* | (2006.01) |
| *H01Q 1/22* | (2006.01) |
| *H01Q 1/44* | (2006.01) |

(52) U.S. Cl.  
CPC ............ *H01Q 13/10* (2013.01); *H01Q 1/2283* (2013.01); *H01Q 1/44* (2013.01)

(58) Field of Classification Search  
CPC ............................... H05K 1/16; H05K 1/0306  
USPC ............................................................ 361/765  
See application file for complete search history.

(56) References Cited

U.S. PATENT DOCUMENTS

| | | | |
|---|---|---|---|
| 4,723,305 | A | 2/1988 | Phillips et al. |
| 5,005,019 | A | 4/1991 | Zaghloul et al. |
| 5,047,898 | A | 9/1991 | Cooke et al. |
| 5,557,142 | A | 9/1996 | Gilmore et al. |
| 6,143,587 | A | 11/2000 | Omizo |
| 6,320,544 | B1 | 11/2001 | Korisch et al. |

(Continued)

FOREIGN PATENT DOCUMENTS

| | | |
|---|---|---|
| CN | 1774804 A | 5/2006 |
| CN | 101635281 A | 1/2010 |

(Continued)

OTHER PUBLICATIONS

Japanese Office Action dated Sep. 24, 2014, issued in counterpart Japanese Application No. 2012-185118.

(Continued)

*Primary Examiner* — Forrest M Phillips  
(74) *Attorney, Agent, or Firm* — Holtz, Holtz, Goodman & Chick PC (57) ABSTRACT

According to one embodiment, a wireless device includes a circuit board, a semiconductor chip, a nonconductive layer, and a conductive film. The semiconductor chip includes a transmitting/receiving circuit and is mounted on the circuit board. The nonconductive layer is to seal the semiconductor chip. The conductive film is to cover a surface of the nonconductive layer, the conductive film being provided with a plurality of apertures serving as radiating elements. At least one aperture of the plurality of apertures is fed with power.

14 Claims, 6 Drawing Sheets

(56) References Cited

U.S. PATENT DOCUMENTS

| | | |
|---|---|---|
| 6,400,037 B1 | 6/2002 | Omizo |
| 6,542,720 B1 | 4/2003 | Tandy |
| 6,818,985 B1 | 11/2004 | Coccioli et al. |
| 6,867,746 B2 | 3/2005 | Mendolia et al. |
| 7,180,012 B2 | 2/2007 | Tsuneoka et al. |
| 7,791,539 B2 | 9/2010 | Castany et al. |
| 7,917,037 B2 | 3/2011 | Liu et al. |
| 8,016,184 B2 | 9/2011 | Kanryo et al. |
| 8,269,674 B2 | 9/2012 | Camacho et al. |
| 8,487,829 B2 | 7/2013 | Takisawa et al. |
| 8,699,234 B2 * | 4/2014 | Kim et al. ............ 361/763 |
| 8,773,323 B1 | 7/2014 | Manry et al. |
| 8,860,190 B2 | 10/2014 | Yamada et al. |
| 2001/0008301 A1 | 7/2001 | Terui |
| 2001/0017770 A1* | 8/2001 | Copetti et al. ......... 361/765 |
| 2005/0157476 A1 | 7/2005 | Goudarzi |
| 2006/0279468 A1 | 12/2006 | Yoneya et al. |
| 2008/0135994 A1 | 6/2008 | Chu et al. |
| 2009/0002967 A1 | 1/2009 | Asami |
| 2009/0194851 A1 | 8/2009 | Chiu et al. |
| 2009/0256244 A1 | 10/2009 | Liao et al. |
| 2010/0013064 A1 | 1/2010 | Hsu |
| 2010/0032815 A1 | 2/2010 | An et al. |
| 2010/0172116 A1 | 7/2010 | Yorita et al. |
| 2010/0207259 A1 | 8/2010 | Liao et al. |
| 2010/0214390 A1 | 8/2010 | Tsujino et al. |
| 2011/0006408 A1 | 1/2011 | Liao |
| 2011/0090658 A1* | 4/2011 | Adams et al. ......... 361/765 |
| 2012/0015687 A1 | 1/2012 | Yamada et al. |
| 2012/0193770 A1 | 8/2012 | Yamada et al. |
| 2012/0292772 A1 | 11/2012 | Yorita et al. |
| 2013/0027255 A1 | 1/2013 | Ito et al. |
| 2013/0222196 A1 | 8/2013 | Hashimoto et al. |
| 2013/0222401 A1 | 8/2013 | Ito et al. |
| 2013/0225102 A1 | 8/2013 | Tsutsumi et al. |

FOREIGN PATENT DOCUMENTS

| | | |
|---|---|---|
| JP | 08250890 A | 9/1996 |
| JP | 10-92981 A | 4/1998 |
| JP | 2001352215 A | 12/2001 |
| JP | 2002-009207 A | 1/2002 |
| JP | 2002016171 A | 1/2002 |
| JP | 2003234615 A | 8/2003 |
| JP | 2004095607 A | 3/2004 |
| JP | 2004-172176 A | 6/2004 |
| JP | 2004159029 A | 6/2004 |
| JP | 2004214584 A | 7/2004 |
| JP | 2004297456 A | 10/2004 |
| JP | 2005210521 A | 8/2005 |
| JP | 2005253043 A | 9/2005 |
| JP | 2005294883 A | 10/2005 |
| JP | 2005341489 A | 12/2005 |
| JP | 2006-173493 A | 6/2006 |
| JP | 2006333454 A | 12/2006 |
| JP | 2007129304 A * | 5/2007 |
| JP | 2007157891 A | 6/2007 |
| JP | 2009-218484 A | 9/2009 |
| JP | 2010-103574 A | 5/2010 |
| JP | 2010114291 A | 5/2010 |
| JP | 2010187107 A | 8/2010 |
| JP | 2010-226137 A | 10/2010 |
| JP | 2010-245931 A | 10/2010 |
| JP | 2010278325 A | 12/2010 |
| JP | 2011239263 A | 11/2011 |
| JP | 2012-039104 A | 2/2012 |
| TW | 201008478 A | 2/2010 |
| TW | 201101452 A | 1/2011 |
| WO | 2004093505 A2 | 10/2004 |

OTHER PUBLICATIONS

U.S. Appl. No. 13/603,790; Title: "Wireless Device, and Information Processing Apparatus and Storage Device Including the Wireless Device"; Filed: Sep. 5, 2012; First Named Inventor: Yukako Tsutsumi.

U.S. Appl. No. 13/603,864; Title: "Wireless Device, and Information Processing Apparatus and Storage Device Including the Wireless Device"; Filed: Sep. 5, 2012; First Named Inventor: Koh Hashimoto.

U.S. Appl. No. 13/600,670; Title: "Semiconductor Package, and Information Processing Apparatus and Storage Device Including the Semiconductor Packages"; Filed: Aug. 31, 2012; First Named Inventor: Takayoshi Ito.

* cited by examiner

WIRELESS DEVICE, AND INFORMATION PROCESSING APPARATUS AND STORAGE DEVICE INCLUDING THE WIRELESS DEVICE

CROSS-REFERENCE TO RELATED APPLICATIONS

This application is based upon and claims the benefit of priority from Japanese Patent Application No. 2012-185118, filed Aug. 24, 2012, the entire contents of which are incorporated herein by reference.

FIELD

Embodiments described herein relate generally to a wireless device including a semiconductor package with an antenna, and an information processing apparatus and a storage device including the wireless device.

BACKGROUND

As the frequency and circuit density of an electronic device become higher and its size becomes smaller, a problem related to interference due to radiation of an undesired electromagnetic wave arises. It is therefore required to suppress leakage of an undesired electromagnetic wave to the outside. There is known a method of covering, with a conductive resin film, the surface of a nonconductive resin layer for sealing a semiconductor chip in order to impart a shielding function to a semiconductor package. There is also proposed a technique of realizing a module which includes a transmission/reception antenna and has a shielding function by forming apertures in a portion, of a conductive resin film and a nonconductive resin layer for sealing a semiconductor chip, which covers the upper surface of the semiconductor chip.

In the conventional techniques, the surface of the semiconductor package with the antenna is covered with a conductive resin film, and apertures for enabling radiation and reception of a desired electromagnetic wave to be used for communication are formed in the conductive resin film. In this case, a diffraction wave occurring in an edge portion of the conductive resin film degrades an antenna gain in a desired radiation direction depending on the package size and the frequency of the desired electromagnetic wave.

DETAILED DESCRIPTION

In general, according to one embodiment, a wireless device includes a circuit board, a semiconductor chip, a nonconductive layer, and a conductive film. The semiconductor chip includes a transmitting/receiving circuit and is mounted on the circuit board. The nonconductive layer is to seal the semiconductor chip. The conductive film is to cover a surface of the nonconductive layer, the conductive film being provided with a plurality of apertures serving as radiating elements. At least one aperture of the plurality of apertures is fed with power.

Wireless devices, information processing apparatuses and storage devices with the wireless devices, according to embodiments will be described hereinafter with reference to the accompanying drawings. In the embodiments, like reference numbers denote like elements, and duplicate descriptions will be avoided.

(First Embodiment)

Figure 1A:
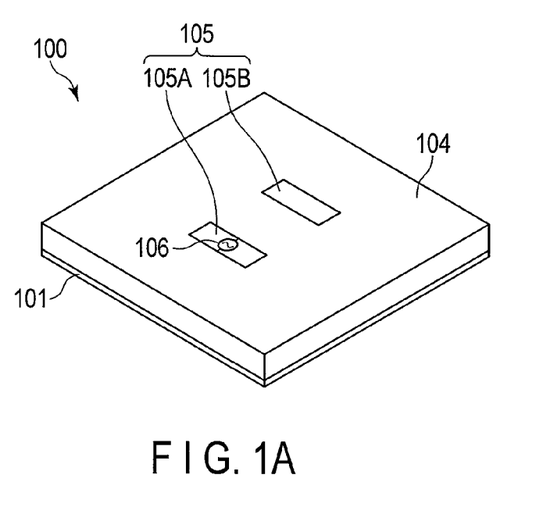
FIG. 1A is a perspective view schematically showing a wireless device according to the first embodiment.
Figure 1B:
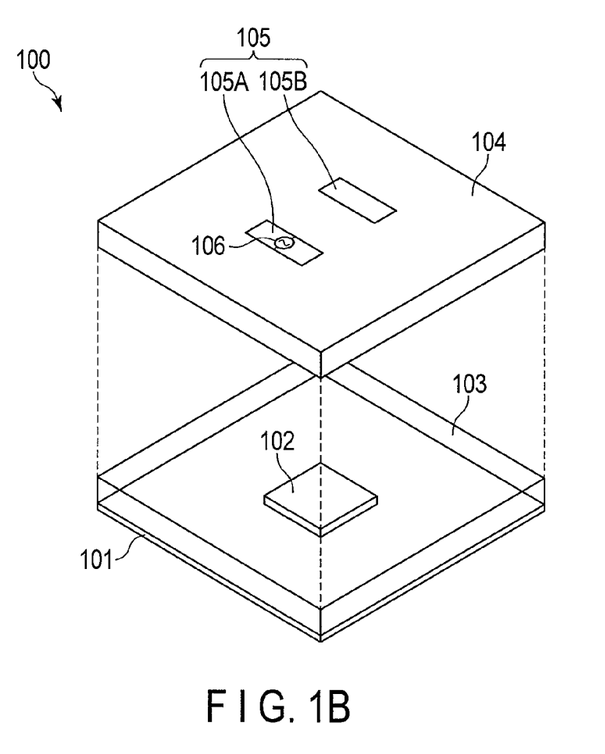
FIG. 1B is an exploded perspective view showing the wireless device of FIG. 1A.

FIG. 1A is a perspective view schematically showing a wireless device 100 according to the first embodiment. FIG. 1B is an exploded perspective view showing the wireless device 100 in order to describe the layer structure of the wireless device 100 shown in FIG. 1A. As shown in FIGS. 1A and 1B, the wireless device 100 includes a circuit board 101, a semiconductor chip 102, a sealing resin 103, a conductive film 104, a plurality of apertures (for example, two apertures) 105, and a feeder 106. Although FIG. 1A shows two apertures 105A and 105B, the number of apertures may be three or more. In the embodiments, the apertures 105 indicate all the apertures of the wireless device 100, and the aperture 105 indicates one or each of the apertures 105. In the example shown in FIG. 1A, the apertures 105 include apertures 105A and 105B. The wireless device will also be referred to as a semiconductor package hereinafter.

The circuit board 101 is formed in a plate shape having a first surface and a second surface which are opposite to each other. The semiconductor chip 102 is arranged on the first surface of the circuit board 101. In the embodiments, for descriptive convenience, a direction perpendicular to the first surface and second surface indicates the vertical direction, and a direction parallel to the first surface and second surface indicates the horizontal direction. A direction from the second surface to the first surface indicates the up direction, and a direction from the first surface to the second surface indicates the down direction. In this case, the first surface is the upper surface, and the second surface is the lower surface.

The semiconductor chip 102 includes a transmitting/receiving circuit for transmitting and receiving signals. The semiconductor chip 102 is formed by a semiconductor substrate made of, for example, silicon, silicon germanium, gallium arsenide, or the like, in the interior or on the surface of which a metal pattern is formed with copper, aluminum, gold, or the like. Note that the semiconductor chip 102 may be formed of a dielectric substrate, magnetic substrate, metal, or a combination thereof. Alternatively, the semiconductor chip 102 may be formed by a chip-size package (CSP). Although one semiconductor chip is arranged in the example shown in FIGS. 1A and 1B, a plurality of semiconductor chips may be arranged. If a plurality of semiconductor chips are arranged, they may be stacked or horizontally disposed on the first surface of the circuit board 101. The semiconductor chip 102 is electrically connected to the wiring of the circuit board 101 or the ground terminal (not shown) via a bonding wire, a bump, or the like.

The semiconductor chip 102 is sealed by the sealing resin 103 corresponding to a nonconductive layer. The conductive film 104 covers most of the surface of the sealing resin 103. A part of the surface of the sealing resin 103 is not covered with the conductive film 104, that is, it is exposed. A surface part of the sealing resin 103 which is not covered with the conductive film 104 will be referred to as an aperture. The two apertures 105A and 105B are formed in the conductive film 104. Apertures 105A and 105B serve as radiating elements for radiating an electromagnetic wave to be used for communication.

More specifically, the sealing resin 103 is formed on the first surface of the circuit board 101 so as to cover the semiconductor chip 102. The conductive film 104 is formed so as to partially cover the surface of the sealing resin 103 and the side surfaces of the circuit board 101. The outer shape of the semiconductor package 100 is defined by the circuit board 101 and conductive film 104, and has a substantially rectangular parallelepiped shape in this embodiment. Apertures 105A and 105B are aligned in the lateral direction (or widthwise direction) of each aperture on the upper surface of the conductive film 104 corresponding to the upper surface of the semiconductor package 100. Setting the dimension of apertures 105A and 105B in their longitudinal direction to about half the wavelength of a desired electromagnetic wave causes apertures 105A and 105B to serve as radiating elements. The dimension of the aperture in its longitudinal direction will be referred to as a slot length hereinafter.

The feeder 106 feeds power to at least one of the apertures 105. In an example, the feeder 106 has an electromagnetic coupling structure using a transmission line, the ends of which are open. In the example of FIG. 1A, aperture 105A is fed with power from the feeder 106 but aperture 105B is not fed with power, that is, aperture 105B serves as a parasitic element. Note that aperture 105B may be an aperture fed with power. If aperture 105B is fed with power, flexible antenna design including a method of laying a transmission line and a power divider is possible. On the other hand, if aperture 105B serves as a parasitic element, flexible antenna design that emphasizes, for example, a maximum antenna gain and frequency band by adjusting the position to form the aperture is possible. Furthermore, the apertures 105 can be used to receive a desired electromagnetic wave to be used for communication. That is, the apertures 105 function as antenna elements.

In the semiconductor package 100, a diffraction wave occurs in an edge portion of the conductive film 104, and is superpositioned on a direct wave radiated by a radiating element. If only one aperture is formed in a conductive film as in a conventional semiconductor package, the radiation pattern is disturbed due to the influence of the diffraction wave. Therefore, an antenna gain may decrease in a desired radiation direction, depending on the semiconductor package size and the frequency of the desired electromagnetic wave.

In this embodiment, aperture 105B different from aperture 105A fed with power is provided as a radiating element so as to cut off a current flowing through the conductive film 104. Aperture 105B radiates an electromagnetic wave by cutting across a current flowing through the conductive film 104. If a plurality of apertures 105 serving as radiating elements are provided in such a manner, the strength of the diffraction wave occurring in the edge portion of the conductive film 104 becomes relatively low with respect to the strength of an electromagnetic wave radiated by the radiating element. As a result, it is possible to suppress the disturbance of the radiation pattern due to the diffraction wave, thereby improving the antenna characteristics.

The conductive film 104 is preferably formed by a metal with a low resistivity to prevent leakage of an undesired electromagnetic wave radiated by the semiconductor chip 102. The conductive film 104 is formed by a metal layer made of, for example, copper, silver, or nickel. The thickness of the conductive film 104 is preferably set based on its resistivity. For example, the thickness of the conductive film 104 is preferably set so that a sheet resistance obtained by dividing the resistivity of the conductive film 104 by its thickness becomes less than or equal to $0.5\Omega$. Setting the sheet resistance of the conductive film 104 to be less than or equal to $0.5\Omega$ can effectively suppress leakage of an undesired electromagnetic wave.

If the conductive film 104 is connected to the ground terminal of the circuit board 101 with a low resistance, a high shielding effect can be obtained. The conductive film 104 is in contact with the side surfaces of the circuit board 101, and is connected to the ground terminal (not shown) of the circuit board 101 on its side surfaces.

The semiconductor package 100 is a ball grid array (BGA) package in which terminals (not shown) formed by solder balls are provided on the second surface of the circuit board 101. The semiconductor package 100 is not limited to the BGA package, and may be any other type of package. The semiconductor package 100 may also be a module formed by a semiconductor chip and a board. Note that in addition to the semiconductor chip 102, components (not shown) such as a chip capacitor and IC may be mounted in a portion of the circuit board 101, which is covered with the sealing resin 103. Furthermore, the semiconductor chip 102 and semiconductor package 100 have a square shape but may have a quadrangular shape such as a rectangular shape, a polygonal shape, a circular shape, or another complex shape. In other words, the outer shape formed by the sealing resin 103 is not limited to a square shape, and may be a quadrangular shape, a polygonal shape other than a quadrangular shape, a circular shape, or another complex shape. The sealing resin 103 is an example of a nonconductive layer. A material forming the nonconductive layer is not limited to a resin. As the material forming the nonconductive layer, it is possible to use another nonconductive material, an insulating material, and the like.

As described above, according to the first embodiment, by forming a plurality of apertures serving as radiating elements in a conductive film, the strength of an electromagnetic wave radiated by the radiating element becomes relatively higher than that of a diffraction wave occurring in an edge portion of the conductive film. As a result, it is possible to suppress the disturbance of the radiation pattern, thereby improving the antenna characteristics.

(Second Embodiment)

In the first embodiment, apertures are formed on one surface (for example, the upper surface) of a conductive film. In contrast, in the second embodiment, apertures are formed on a plurality of surfaces of a conductive film. More specifically, in the second embodiment, on a surface different from that on which an aperture fed with power from a feeder is formed, another aperture is formed.

Figure 2:
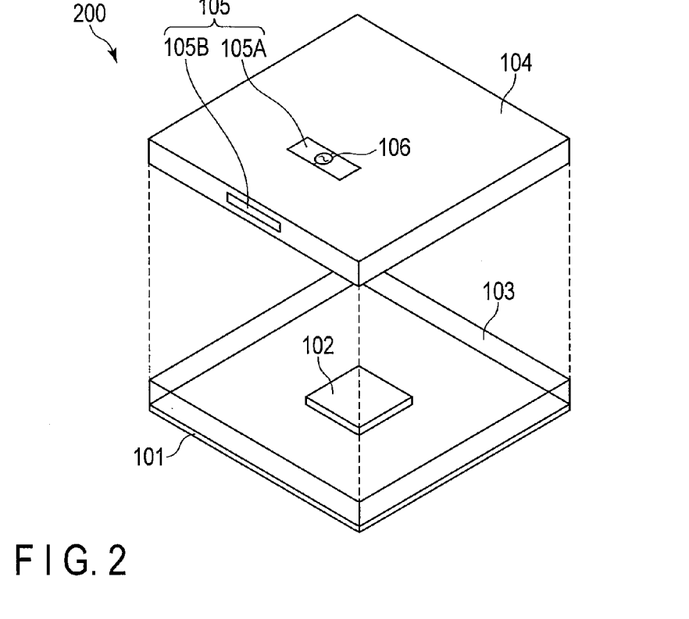
FIG. 2 is an exploded perspective view showing a wireless device according to the second embodiment.

FIG. 2 is an exploded perspective view showing a wireless device 200 according to the second embodiment. In the wireless device 200, as shown in FIG. 2, an aperture 105A fed with power from a feeder 106 is formed on the upper surface of a conductive film 104, and an aperture 105B is formed on a side surface of the conductive film 104. If apertures 105 are formed on the upper surface of the conductive film 104 as in the first embodiment, the main radiation direction of an electromagnetic wave is the up direction within a vertical plane. On the other hand, if aperture 105A is formed on the upper surface of the conductive film 104 and aperture 105B is formed on the side surface of the conductive film 104 as in this embodiment, the main radiation direction of an electromagnetic wave can tilt toward the side-surface direction of a semiconductor package 100 from the up direction.

The arrangement of the apertures according to this embodiment is not limited to that shown in FIG. 2, and apertures need only be formed on a plurality of surfaces of the conductive film. For example, aperture 105A fed with power from the feeder 106 may be formed on a side surface of the conductive film 104. Aperture 105B is shown as a parasitic element in FIG. 2 but may be an aperture fed with power from the feeder.

As described above, according to the second embodiment, in addition to the effects of the first embodiment, it is possible to increase the degree of freedom of the radiation direction of an electromagnetic wave by forming a plurality of apertures serving as radiating elements on a plurality of surfaces of a conductive film.

(Third Embodiment)

The third embodiment is different from the first and second embodiments in that at least one of a plurality of apertures extends through a plurality of surfaces (for example, two surfaces) of a conductive film.

Figure 3:
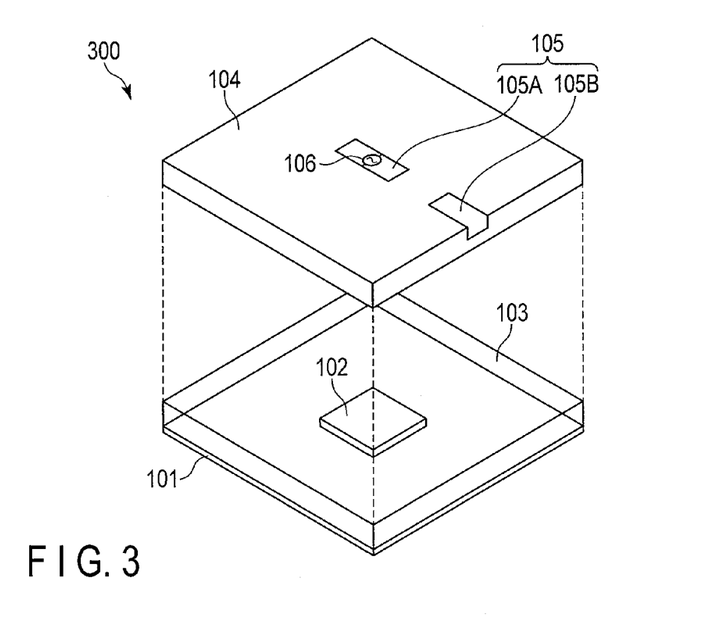
FIG. 3 is an exploded perspective view showing a wireless device according to the third embodiment.

FIG. 3 is an exploded perspective view showing a wireless device 300 according to the third embodiment. In the wireless device 300, as shown in FIG. 3, an aperture 105A fed with power from a feeder 106 is formed on the upper surface of a conductive film 104, and an aperture 105B is formed from the upper surface to a side surface of the conductive film 104 (or semiconductor package 300). Apertures 105A and 105B are disposed in their longitudinal direction.

To radiate a horizontally polarized wave in the side-surface direction of the semiconductor package 300, it is necessary to form an aperture 105 on a side surface of the conductive film 104 so that the longitudinal direction of the aperture 105 coincide with the vertical direction. If, however, the height of the semiconductor package 300 is less than about half the wavelength of a desired electromagnetic wave, it is impossible to obtain the resonant length of a slot antenna.

In this embodiment, aperture 105B is formed in an L-shape which extends from the upper surface to the side surface of the conductive film 104. By setting the entire length (that is, the slot length) of L-shaped aperture 105B to about half the wavelength of the desired electromagnetic wave, it becomes possible to efficiently radiate and receive the desired electromagnetic wave. By forming L-shaped aperture 105B which extends from the upper surface to the side surface of the conductive film 104, it becomes possible to increase horizontally polarized wave components in the side-surface direction of the semiconductor package 300.

Note that the arrangement of the apertures according to this embodiment is not limited to that shown in FIG. 3 in which aperture 105B serving as a parasitic element extends through the plurality of surfaces of the conductive film 104, and at least one aperture need only extend through a plurality of surfaces of the conductive film. For example, aperture 105A fed with power from the feeder 106 may be formed in an L-shape which extends from the upper surface to the side surface of the conductive film 104, and aperture 105B serving as a parasitic element may be formed on the upper surface of the conductive film 104. Furthermore, both apertures 105A and 105B may be fed with power.

As described above, according to the third embodiment, in addition to the effects of the first embodiment, it is possible to increase the degree of freedom of the radiation direction of an electromagnetic wave by forming at least one of a plurality of apertures serving as radiating elements on a plurality of surfaces of a conductive film.

(Fourth Embodiment)

Figure 4:
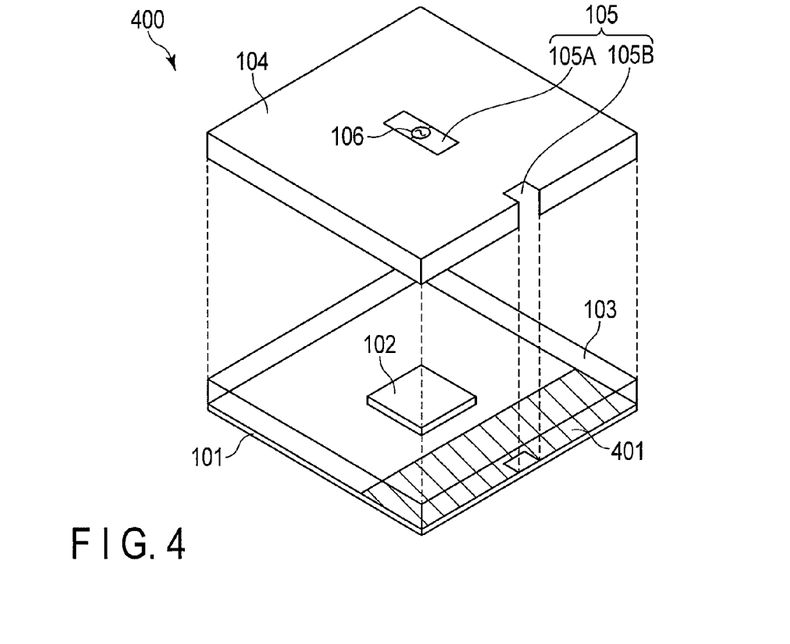
FIG. 4 is an exploded perspective view showing a wireless device according to the fourth embodiment.

The fourth embodiment is different from the first to third embodiments in that at least one aperture is formed from the upper surface through a side surface to the lower surface. A wireless device according to the fourth embodiment will be described with reference to FIG. 4. FIG. 4 is an exploded perspective view showing a wireless device 400 according to the fourth embodiment.

If an L-shaped aperture is used as in the third embodiment, the radiation direction of the antenna is set to the elevation direction, and thus the device is not appropriate for radiation in the horizontal or depression direction.

In this embodiment, as shown in FIG. 4, an aperture formed in a metal pattern 401 inside a circuit board 101 forms a part of an aperture 105B. The metal pattern 401 is indicated by hatch lines in FIG. 4. The metal pattern 401 is formed almost parallel to the upper surface of a conductive film 104. More specifically, aperture 105B is formed by an aperture formed from the upper surface to the side surface of the conductive film 104 and the aperture formed in the metal pattern 401. That is, aperture 105B is formed in a U-shape to extend through the upper surface of the conductive film 104, the side surface of the conductive film 104, and the metal pattern 401 inside the circuit board 101. The metal pattern 401 is electrically connected to the conductive film 104. Note that an aperture different from aperture 105B may be formed in the metal pattern 401. Furthermore, the metal pattern 401 may include a transmission line. By setting the entire length (that is, the slot length) of U-shaped aperture 105B to about half the wavelength of a desired electromagnetic wave, it becomes possible to efficiently radiate and receive the desired electromagnetic wave. In other words, aperture 105B is formed at the surface part of a sealing resin 103, which is not covered with the conductive film 104 and metal pattern 401.

If a U-shaped aperture is formed, it is possible to change the radiation direction of an antenna by adjusting the slot length on the upper surface of the conductive film 104 and the slot length in the metal pattern 401. For example, if the slot length on the upper surface of the conductive film 104 is increased, the radiation direction inclines to the elevation direction. In contrast, if the slot length in the metal pattern 401 is increased, the radiation direction inclines to the depression direction.

As described above, according to the fourth embodiment, in addition to the effects of the first embodiment, it is possible to increase the degree of freedom of the radiation direction of an electromagnetic wave by making at least one of the plurality of apertures serving as radiating elements extend through three surfaces of the semiconductor package.

(Fifth Embodiment)

In the fifth embodiment, a plurality of apertures serving as radiating elements are almost symmetrically formed in a conductive film.

Figure 5:
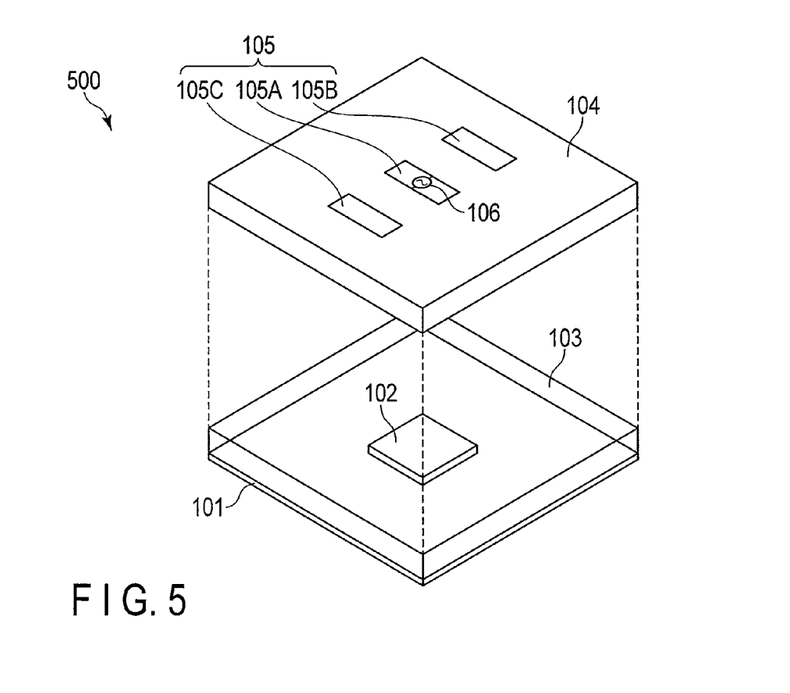
FIG. 5 is an exploded perspective view showing a wireless device according to the fifth embodiment.

FIG. 5 is an exploded perspective view showing a wireless device 500 according to the fifth embodiment. As shown in FIG. 5, three apertures 105A, 105B, and 105C serving as radiating elements are almost symmetrically formed on the upper surface of a conductive film 104. Aperture 105A fed with power from a feeder 106 is arranged between apertures 105B and 105C serving as parasitic elements.

In the wireless device 500 according to this embodiment, in addition to the effects of the first embodiment, it is possible to obtain an almost symmetrical radiation pattern by symmetrically feeding power from the feeder 106. Note that symmetrical power feed means that apertures are symmetrically formed and apertures fed with power are symmetrically formed. For example, referring to FIG. 5, aperture 105A may serve as a parasitic element, and apertures 105B and 105C may be fed with power. Alternatively, all apertures 105A, 105B, and 105C may be fed with power.

Note that the symmetrical arrangement of the apertures is not limited to that shown in FIG. 5 in which apertures 105A, 105B, and 105C are formed on the upper surface of the conductive film 104. In one example, apertures 105B and 105C are formed on side surfaces of the conductive film 104. In another example, apertures 105A, 105B, and 105C are formed to extend through a plurality of surfaces (for example, the upper surface and the side surface) of the conductive film 104.

(Sixth Embodiment)

A method of feeding power to an aperture according to the sixth embodiment is different from that in the first to fifth embodiments. More specifically, in the sixth embodiment, at least one aperture extending from the upper surface through the side surface to the lower surface is fed with power from a feed line included in a circuit board.

Figure 6:
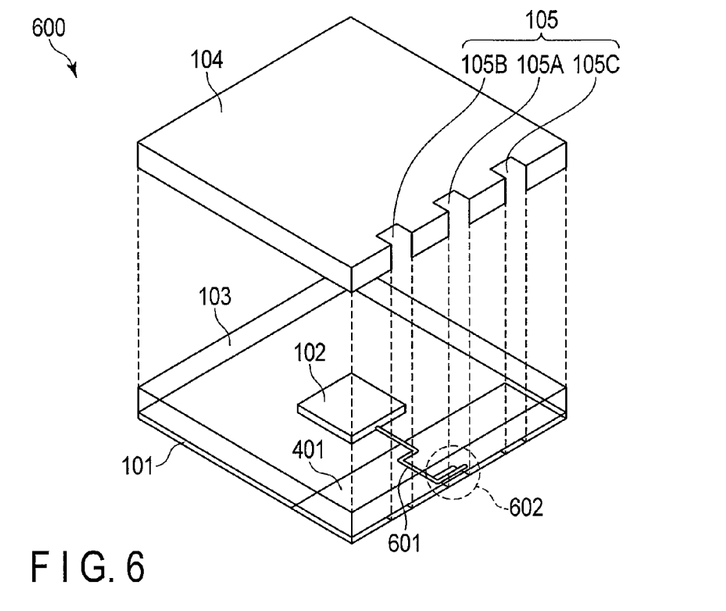
FIG. 6 is an exploded perspective view showing a wireless device according to the sixth embodiment.

FIG. 6 is an exploded perspective view showing a wireless device 600 according to the sixth embodiment. As shown in FIG. 6, the wireless device 600 includes three apertures 105A, 105B, and 105C serving as radiating elements. As described in the fourth embodiment, each of apertures 105A, 105B, and 105C is formed in a U-shape so as to extend from the upper surface to a side surface of a conductive film 104 and to a metal pattern 401 inside a circuit board 101. That is, each of apertures 105A, 105B, and 105C is formed on the surface part of a sealing resin 103, which is not covered with the conductive film 104 and metal pattern 401. The metal pattern 401 is electrically connected to the conductive film 104. In the example of FIG. 6, aperture 105A is fed with power from a feeder 602 using a feed line 601 provided inside the circuit board 101. It is possible to obtain preferable unidirectionality in the package side-surface direction within a vertical plane by using U-shaped aperture 105A as a main radiating element.

Figure 7:
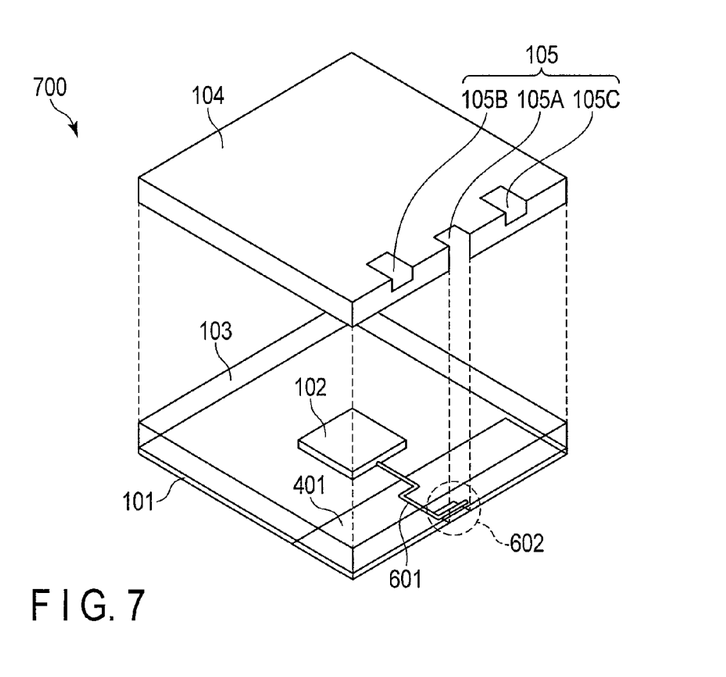
FIG. 7 is an exploded perspective view showing a wireless device according to a modification of the sixth embodiment.

If the semiconductor package 600 is mounted on a dielectric mounting substrate, an electromagnetic field is attracted toward the dielectric, and thus the main radiation direction is set to the depression direction. In this case, it is possible to set the radiation direction within the vertical plane close to the horizontal direction by reducing the slot length of each U-shaped aperture 105 in the metal pattern 401. If, however, the slot length in the metal pattern, of U-shaped aperture 105A fed with power is reduced too much, the coupling between the feed line 601 and aperture 105A weakens. This decreases the antenna gain, and thus the radiation direction cannot be directed to the horizontal direction. On the other hand, since each of apertures 105B and 105C serving as parasitic elements radiates an electromagnetic wave by cutting across a current flowing through the conductive film and metal pattern, even if the slot length in the metal pattern is reduced, each of apertures 105B and 105C radiates an electromagnetic wave by maintaining its entire length. If it is impossible to direct the main radiation direction to the horizontal direction using the U-shaped aperture, it is possible to realize radiation in the horizontal direction by forming, in an L-shape, apertures 105B and 105C serving as parasitic elements, as in a wireless device 700 shown in FIG. 7.

As described above, according to the sixth embodiment, in addition to the effects of the first embodiment, it is possible to obtain preferable unidirectionality in the package side-surface direction within the vertical plane by feeding power to the aperture formed from the upper surface through the side surface to the lower surface, and using the aperture as the main radiating element.

(Seventh Embodiment)

In the first to sixth embodiments, an aperture formed in a conductive film is fed with power. In contrast, in the seventh embodiment, an antenna element included in a semiconductor package is fed with power.

Figure 8:
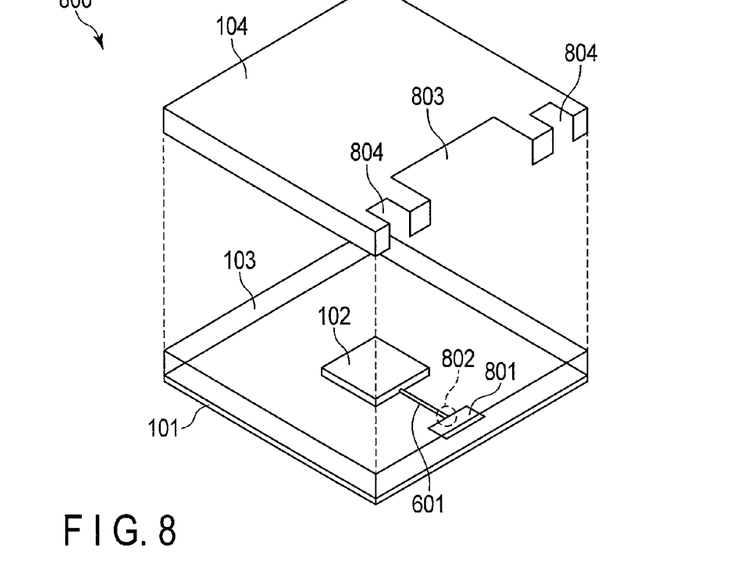
FIG. 8 is an exploded perspective view showing a wireless device according to the seventh embodiment.

FIG. 8 is an exploded perspective view showing a wireless device 800 according to the seventh embodiment. As shown in FIG. 8, the wireless device 800 includes an antenna element 801 serving as a main radiating element. The antenna element 801 is formed at a position different from that of a semiconductor chip 102 on the first surface of a circuit board 101. Note that this embodiment is not limited to the example in which the antenna element 801 is provided on the circuit board 101, and the antenna element 801 may be provided on the semiconductor chip 102. The antenna element 801 and semiconductor chip 102 are sealed by a sealing resin 103. The antenna element 801 is fed with power from a feed line 601 provided inside the circuit board 101. An aperture 803 is formed in a conductive film 104 so as not to disturb radiation of the antenna in a desired radiation direction. Aperture 803 is a non-radiating element. An electromagnetic wave radiated by the antenna element 801 via aperture 803 also receives the influence of a diffraction wave occurring in an edge portion of the package.

Apertures 804 are formed as radiating elements on both sides of aperture 803 so as to cut across a current flowing through the conductive film. It is possible to relatively weaken the strength of the diffraction wave and to suppress degradation in radiation pattern of the antenna by positively radiating an electromagnetic wave from apertures 804. Note that the number of apertures serving as radiating elements is not limited to two, and may be one, or three or more. A feeder 802 may have a structure in which the antenna element 801 and feed line 601 are DC-connected to each other, or an electromagnetic coupling structure in which the antenna element 801 and feed line 601 are not DC-connected to each other.

Figure 9:
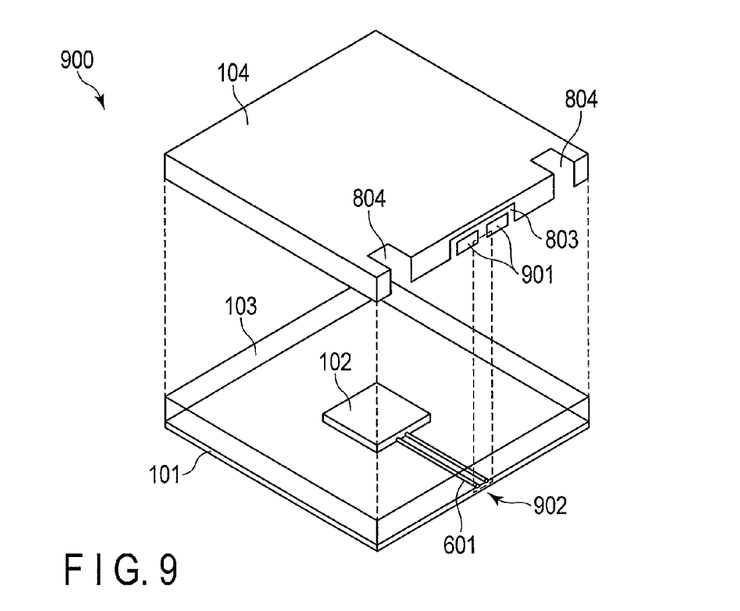
FIG. 9 is an exploded perspective view showing a wireless device according to a modification of the seventh embodiment.

A modification of the antenna element will be described with reference to FIG. 9. FIG. 9 shows a case in which an antenna element 901 is a dipole antenna. The antenna element 901 shown in FIG. 9 is formed on the surface (side surface) of the sealing resin 103 using part of the conductive film 104. The antenna element 901 is fed with power from the feed line 601 provided inside the circuit board 101. Aperture 803 of the non-radiating element is formed in the conductive film 104 so as not to disturb radiation of the antenna in a desired radiation direction. Referring to FIG. 9, a feeder 902 and the antenna element 901 are arranged on the side surface of a semiconductor package 900. However, the feeder 902 and antenna element 901 may be arranged on the upper surface of the semiconductor package 900 by extending the feed line 601 using the conductive film 104. Note that the antenna element is not limited to the dipole antenna 901 shown in FIG. 9, and may be another antenna element such as a loop antenna or folded dipole antenna.

As described above, according to the seventh embodiment, it is possible to relatively weaken a diffraction wave occurring in an edge portion of the semiconductor package by forming at least one aperture serving as a radiating element together with an aperture serving as a non-radiating element for radiation from the antenna element. As a result, it is possible to suppress degradation in radiation pattern of the antenna, thereby improving the antenna characteristics.

(Eighth Embodiment)

In the eighth embodiment, an information processing apparatus and a storage device will be described, which incorporate one of the wireless devices described in the first to seventh embodiments.

An information processing apparatus incorporating one of the above-mentioned wireless devices will be explained with reference to FIGS. 10 and 11. The information processing apparatus is a generic name of a wireless apparatus that incorporates one of the above-mentioned wireless devices and perform exchange of data and still and moving images.

Figure 10:
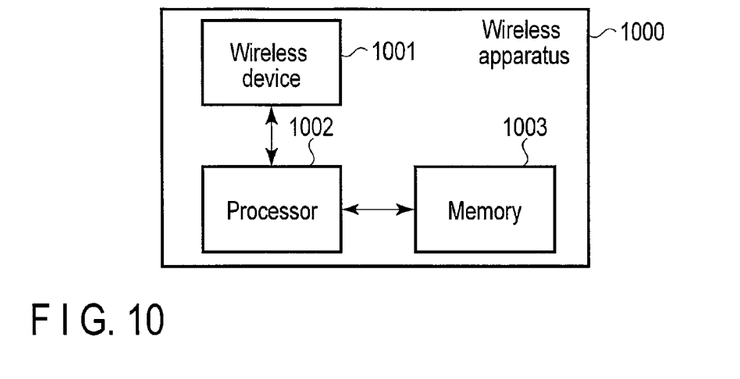
FIG. 10 is a block diagram schematically showing a wireless apparatus according to the eighth embodiment.

A wireless apparatus 1000 shown in FIG. 10 includes a wireless device 1001, a processor 1002, and a memory 1003.

The wireless device 1001 transmits and receives data to and from an external device. The wireless device 1001 is one of the semiconductor packages (i.e., wireless devices) described in the first to seventh embodiments.

The processor (also called a controller) 1002 processes data received from the wireless device 1001 and data to be transmitted to the wireless device 1001.

The memory 1003 stores data. The memory 1003 receives data from the processor 1002 to store it, and provides data to the processor 1002.

Examples of the wireless apparatus with the wireless device 1001 will be described with reference to FIG. 11.

Examples of the wireless apparatus are a laptop personal computer (laptop PC) 1101 and a mobile terminal 1102. The laptop PC 1101 and mobile terminal 1102 have displays 1103 and 1104 for displaying a still image and moving images. Each of the laptop PC 1101 and mobile terminal 1102 also includes a central processing unit (CPU) (also called a control unit), a memory, etc. Each of the laptop PC 1101 and mobile terminal 1102 further includes the internal or external wireless device 1001 through which data communication is performed using a frequency of, for example, a millimeter-wave band. Each of the laptop PC 1101 and mobile terminal 1102 may incorporate any one of the above-mentioned semiconductor packages.

The wireless device of the laptop PC 1101 and that of the mobile terminal 1102 can efficiently exchange data when they are arranged so that the directions in which their radiating elements have a high directivity oppose each other.

Figure 11:
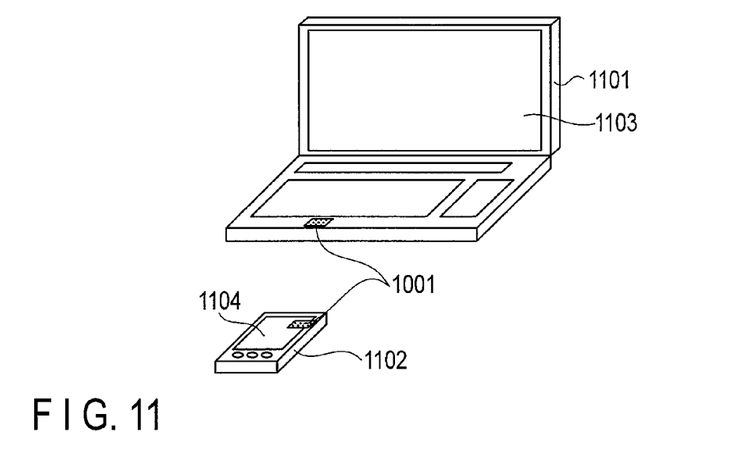
FIG. 11 is a view showing an example of a wireless apparatus provided with a wireless device.

Although the laptop PC 1101 and mobile terminal 1102 are shown in the example of FIG. 11, the eighth embodiment is not limited to them. The wireless device may be incorporated in, for example, a television receiver, a digital camera, a memory card, etc.

Figure 12:
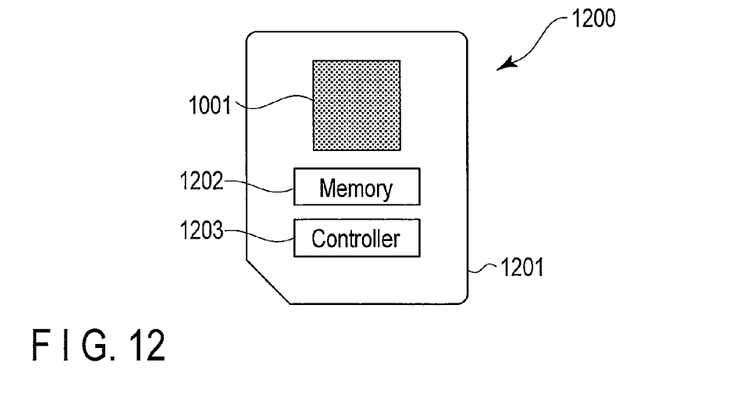
FIG. 12 is a view showing a case in which a wireless device is mounted in a memory card.

A case in which the wireless device is installed in a memory device will be described with reference to FIG. 12. In the example of FIG. 12, a storage device is a memory card 1200.

As shown in FIG. 12, the memory card 1200 includes the wireless device 1001 and a memory card body 1201, and can communicate with a laptop PC, a mobile terminal, a digital camera, or the like via the wireless device 1001. The memory card body 1201 includes a memory 1202 for storing information, and a controller 1203 for controlling the memory card as a whole.

According to the eighth embodiment described above, it is possible to suppress degradation in radiation characteristics of the antenna to efficiently transmit/receive data and the like while suppressing degradation in shielding effect for an undesired electromagnetic wave, by incorporating the wireless device (semiconductor package) described in each of the first to seventh embodiments in each of the storage device and the information processing apparatus such as a laptop PC, mobile terminal, or memory card which makes wireless data communication.

According to at least one embodiment described above, it is possible to suppress the influence of a diffraction wave occurring in an edge portion of a conductive film to improve the antenna characteristics by forming a plurality of apertures serving as radiating elements in the conductive film in addition to an aperture serving as a radiating element or an aperture for radiating an electromagnetic wave from an antenna element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless device comprising:
a circuit board;
a semiconductor chip comprising a transmitting/receiving circuit, the semiconductor chip being mounted on the circuit board;
a nonconductive layer to seal the semiconductor chip;
a conductive film to cover at least a part of a surface of the nonconductive layer and a part of side surfaces of the circuit board, the conductive film being provided with a plurality of apertures serving as radiating elements, wherein at least one aperture of the plurality of apertures is fed with power; and
a metal pattern which is provided on the circuit board and electrically connected to the conductive film, wherein at least one of the plurality of apertures is formed to extend through the conductive film and the metal pattern.

2. The device according to claim 1, wherein at least one of the plurality of apertures, which is different from the at least one aperture fed with power, serves as a parasitic element.

3. The device according to claim 1, wherein at least one aperture of the plurality of apertures is formed on a surface of the conductive film different from a surface of the conductive film on which the at least one aperture fed with power is formed.

4. The device according to claim 1, wherein at least one aperture of the plurality of apertures is formed to extend through a plurality of surfaces of the conductive film.

5. An information processing apparatus comprising:
the wireless device according to claim 1;
a controller to process data to be exchanged with the wireless device;
a memory to store the data; and
a display to display an image corresponding to the data.

6. A storage device comprising:
the wireless device according to claim 1;
a controller to process data to be exchanged with the wireless device; and
a memory to store the data.

7. The device according to claim 1, wherein the plurality of apertures are substantially symmetrically formed in the conductive film.

8. The device according to claim 1, wherein the at least one aperture fed with power is formed to extend through the conductive film layer and the metal pattern.

9. A wireless device comprising:
- a circuit board;
- a semiconductor chip comprising a transmitting/receiving circuit, the semiconductor chip being mounted on the circuit board;
- a nonconductive layer to seal the semiconductor chip;
- a conductive film to cover at least a part of a surface of the nonconductive layer and a part of side surfaces of the circuit board, the conductive film being provided with a plurality of apertures;
- a metal pattern which is provided on the circuit board and electrically connected to the conductive film; and
- an antenna element,
- wherein the plurality of apertures include at least one first aperture serving as a radiating element and at least one second aperture used to radiate an electromagnetic wave from the antenna element, and wherein at least one of the at least one first aperture is formed to extend through the conductive film and the metal pattern.

10. The device according to claim 9, wherein at least one aperture of the at least one first aperture serves as a parasitic element.

11. The device according to claim 9, wherein at least one aperture of the at least one first aperture is formed to extend through a plurality of surfaces of the conductive film.

12. The device according to claim 9, wherein the at least one first aperture is substantially symmetrically formed in the conductive film.

13. An information processing apparatus comprising:
- the wireless device according to claim 9;
- a controller to process data to be exchanged with the wireless device;
- a memory to store the data; and
- a display to display an image corresponding to the data.

14. A storage device comprising:
- the wireless device according to claim 9;
- a controller to process data to be exchanged with the wireless device; and
- a memory to store the data.

* * * * *